(12) United States Patent
Edman et al.

(10) Patent No.: US 11,605,845 B2
(45) Date of Patent: Mar. 14, 2023

(54) STRATEGIES FOR WARMING STATIONARY VEHICLE TRACTION BATTERY

(71) Applicant: FORD GLOBAL TECHNOLOGIES, LLC, Dearborn, MI (US)

(72) Inventors: Rian Edman, Dearborn, MI (US); Kelly Johnson, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 92 days.

(21) Appl. No.: 17/143,816

(22) Filed: Jan. 7, 2021

(65) Prior Publication Data
US 2022/0216535 A1   Jul. 7, 2022

(51) Int. Cl.
| | |
|---|---|
| *H01M 10/615* | (2014.01) |
| *H01M 50/249* | (2021.01) |
| *H01M 10/635* | (2014.01) |
| *G01R 31/387* | (2019.01) |
| *H01M 10/625* | (2014.01) |

(52) U.S. Cl.
CPC ........ *H01M 10/615* (2015.04); *G01R 31/387* (2019.01); *H01M 10/625* (2015.04); *H01M 10/635* (2015.04); *H01M 50/249* (2021.01)

(58) Field of Classification Search
CPC ............. H01M 10/615; H01M 10/625; H01M 10/635; H01M 50/249; G01R 31/387
See application file for complete search history.

(56) References Cited

U.S. PATENT DOCUMENTS

| | | |
|---|---|---|
| 9,431,688 B2 | 8/2016 | Schwarz et al. |
| 9,446,756 B2 | 9/2016 | Chen et al. |
| 2019/0039477 A1 | 2/2019 | Ohgaki et al. |
| 2020/0070808 A1* | 3/2020 | Ota .......................... F02N 11/04 |

OTHER PUBLICATIONS

U.S. Appl. No. 16/743,441, filed Jan. 15. 2020; 52 Pages.

* cited by examiner

*Primary Examiner* — Karie O'Neill Apicella
(74) *Attorney, Agent, or Firm* — David B Kelley; Brooks Kushman P.C.

(57) ABSTRACT

A vehicle includes an engine, an electric machine, a traction battery, and a controller. The controller, responsive to the vehicle not moving, a temperature of the traction battery being less than a temperature threshold, and a state-of-charge of the traction battery being greater than a state-of-charge threshold, rotates the engine via the electric machine powered by the traction battery while no fuel is supplied to the engine.

12 Claims, 5 Drawing Sheets

STRATEGIES FOR WARMING STATIONARY VEHICLE TRACTION BATTERY

TECHNICAL FIELD

The present disclosure relates to an electrified vehicle having a traction battery.

BACKGROUND

An electrified vehicle may be powered by one or more high voltage lithium-ion traction batteries. Due to the nature of the lithium-ion batteries, the power performance of the traction battery may be limited in cold environments.

SUMMARY

A vehicle includes an engine, an electric machine coupled to the engine, a traction battery that supplies power to the electric machine, and a controller. The controller, responsive to the vehicle not moving, a temperature of the traction battery being less than a first temperature threshold, and a state-of-charge (SOC) of the traction battery being greater than a first SOC threshold, rotates the engine via the electric machine powered by the traction battery while no fuel is supplied to the engine.

A method includes, while a temperature of a traction battery is less than a first temperature threshold, rotating an engine with an electric machine coupled thereto when no fuel is supplied to the engine.

A powertrain system includes a traction battery and a controller. The controller, while a temperature of the traction battery is less than a first temperature threshold and a state-of-charge (SOC) of the traction battery is greater than a first SOC threshold, commands the traction battery to provide power to an electric machine to rotate an engine mechanically coupled therewith while no fuel is supplied to the engine.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
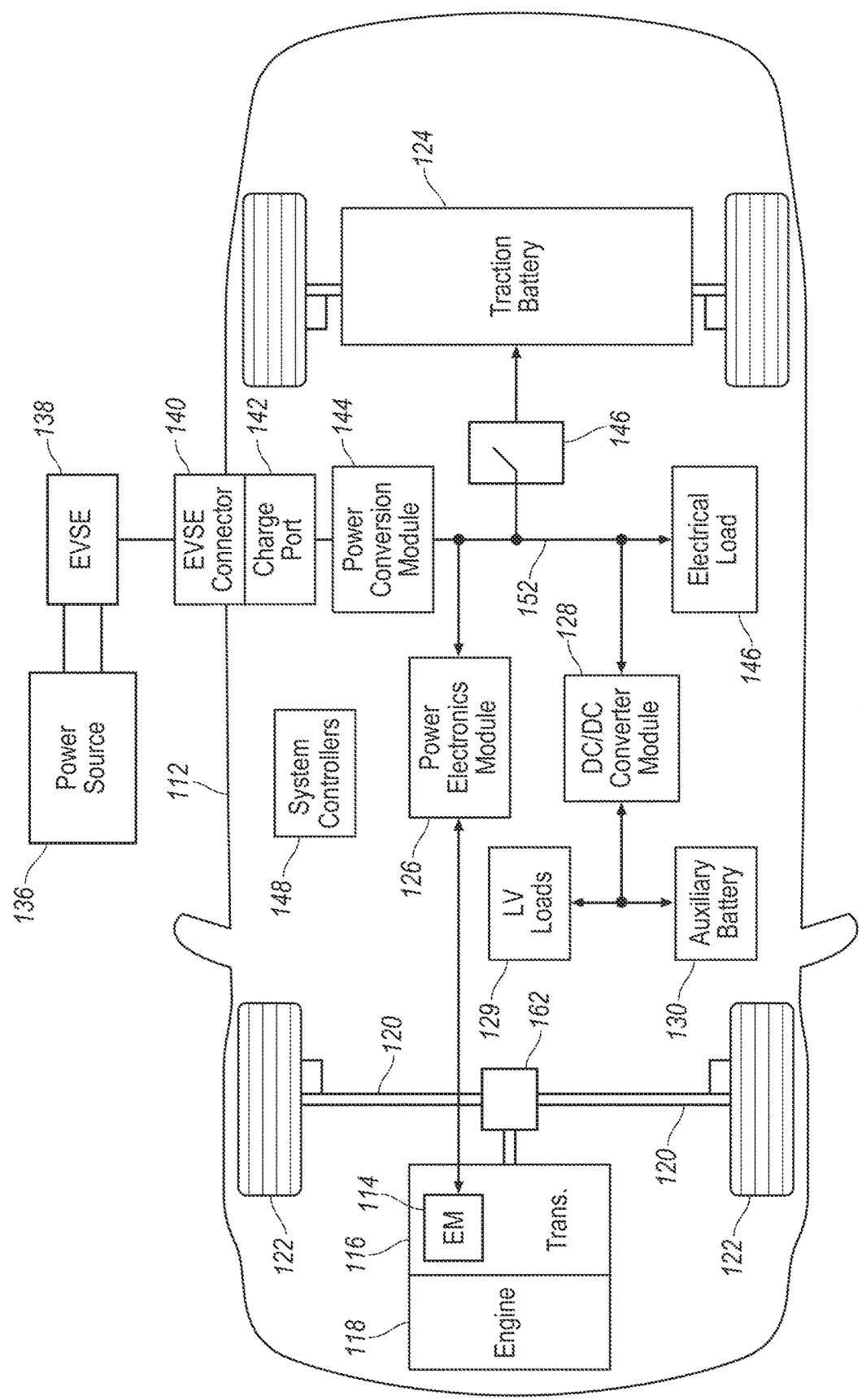
FIG. 1 is a diagram of an electrified vehicle illustrating drivetrain and energy storage components including an electric machine.

FIG. 1 depicts an electrified vehicle 112 that may be referred to as a plug-in hybrid-electric vehicle (PHEV), a battery electric vehicle (BEV), a mild hybrid-electric vehicle (MHEV), and/or full hybrid electric vehicle (FHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and braking capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. The electrified vehicle 112 may also be a BEV. In a BEV configuration, the engine 118 may not be present.

A traction battery or battery pack 124 stores energy that can be used by the electric machines 114. The vehicle battery pack 124 may provide a high voltage direct current (DC) output. The traction battery 124 may be electrically coupled to one or more power electronics modules 126 (such as a traction inverter). The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) (not shown) electrically coupled between the traction battery 124 and the power electronics module 126. The VVC may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads 129. An output of the DC/DC converter module 128 may be electrically coupled to an auxiliary battery 130 (e.g., 12V battery)

for charging the auxiliary battery 130. The low-voltage systems may be electrically coupled to the auxiliary battery 130.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 142 of the vehicle 112. The charge port 142 may be any type of port configured to transfer power from the EVSE 138 to the vehicle 112. The charge port 142 may be electrically coupled to a charger or on-board power conversion module 144. The power conversion module 144 may condition the power supplied from the EVSE 138 to provide the proper voltage and current levels to the traction battery 124. The power conversion module 144 may interface with the EVSE 138 to coordinate the delivery of power to the vehicle 112. The EVSE connector 140 may have pins that mate with corresponding recesses of the charge port 142. Alternatively, various components described as being electrically coupled or connected may transfer power using a wireless inductive coupling. Additionally, the charge port 142 may be configured to output DC electric power from the traction battery 124 through the power conversion module 144. One or more contactors 146 may isolate the traction battery 124 from other components when opened and connect the traction battery 124 to other components when closed.

Electronic modules/controllers in the vehicle 112 may communicate via one or more vehicle networks (to be described in detail below). The vehicle network may include a plurality of channels for communication. Channels of the vehicle network may include discrete connections between modules and may include power signals from the auxiliary battery 130. Different signals may be transferred over different channels of the vehicle network. For example, video signals may be transferred over a high-speed channel while control signals may be transferred over a low speed channel. The vehicle network may include any hardware and software components that aid in transferring signals and data between modules. One or more system controllers 148 may be present to perform and coordinate various operations of the vehicle 112. Each of the system controller 148 may be provided with one or more processors and software applications configured to monitor and control operations of various components of the vehicle 112. For instance, the system controllers 148 may include a power control module (PCM) configured to operate the powertrain of the vehicle 112. The system controllers 148 may further include a battery electronic control module (BECM) configured to monitor and control various operations of the traction battery 124. Alternatively, the BECM may be integrated with the traction battery 124 and configured to communicate with other system controllers 148 via the vehicle network.

The performance of the traction battery 124 may be limited in cold environments. The present disclosure proposes a system and method for warming up the traction battery 124 in cold conditions. More specifically, the present disclosure proposes a system and method for warming up the traction battery 124 when the vehicle is stationary.

Figure 2:
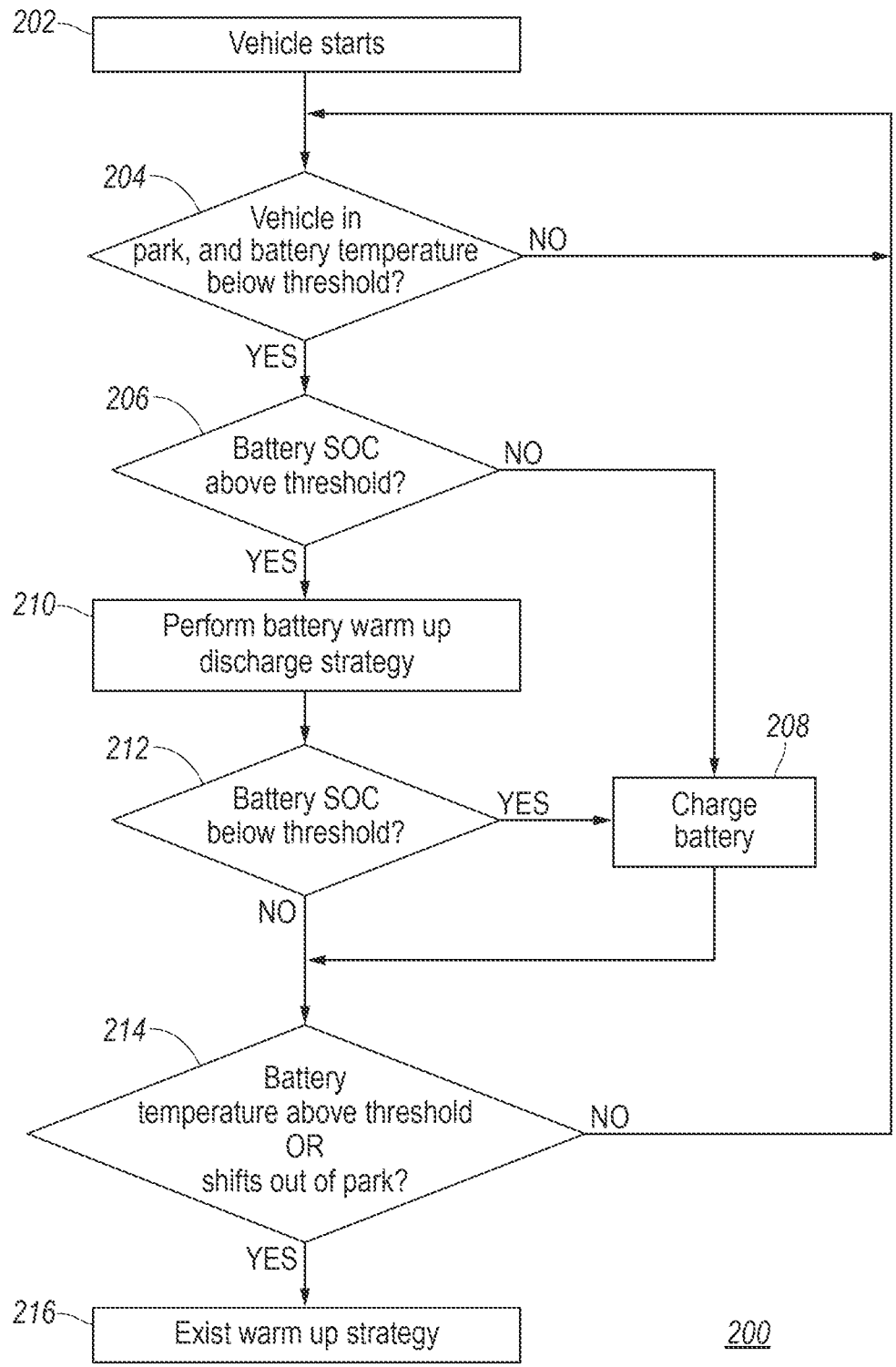
FIG. 2 is a flow diagram of a battery warm-up strategy control process.

Referring to FIG. 2, a flow diagram for a battery warm-up strategy process 200 is illustrated. While the process 200 (as well as other processes described below) may be individually or collectively performed via one or more controllers of the vehicle 112, the following description will be made with reference to the system controller 148 as a non-limiting example for illustrative purpose. With continuing reference to FIG. 1, responsive to detecting a vehicle start event at operation 202 (e.g., a user locally or remotely starting the vehicle), at operation 204 the system controller 148 verifies if the vehicle is in Parking gear, and the battery temperature is below a predefined threshold (e.g., 0 degree C.). If the answer is a yes, the process proceeds to operation 206 and the system controller 148 verifies if the state-of-charge (SOC) of the traction battery 124 is above an SOC threshold (e.g., 60%) sufficient to perform the warm-up process. If the answer is a no, the process proceeds to operation 208 and starts the battery charging process. For instance, the system controller 148 may start the vehicle engine 118 which may drive the electric machine 114 to generate electricity. Additionally, a torque adder may be implemented to the engine 118 during the charging process to provide additional torque so that the electric machine 114 may generate the electricity more quickly. If the answer for operation 206 is a yes, indicative of the traction battery 124 having sufficient SOC, the process proceeds to operation 210 to perform the stationary battery warm-up discharge strategy process. For instance, the system controller 148 may discharge the traction battery 124 to power the electrical load 146 and/or power the rotation of the engine 118 via a crankshaft (not shown). Details of the warm-up process will be described in detail below.

At operation 212, the system controller 148 verifies if the SOC of the traction battery 124 has dropped below a calibration threshold due to the discharge. The calibration threshold (e.g., 40%) may be preferably lower than the SOC threshold (e.g., 60%) used at operation 206 to define a range within which the warm-up process may be performed. Alternatively, the calibration threshold may be the same as the SOC threshold used at operation 206 for instance. If the answer for operation 212 is a yes, the process proceeds to operation 208 to charge the battery 124. Otherwise, the process proceeds to operation 214 and the system controller 148 verifies if the battery temperature has increased above a temperature threshold (e.g., 10 degree C.) or the vehicle has shifted out of the Parking gear. Here, the temperature threshold may be different or the same from the temperature threshold used at operation 204 depending on the specific design needs. If the answer for operation 214 is a no, the process returns to operation 204 to continue to perform the stationary battery warm-up process. Otherwise, the process proceeds to operation 216 and the system controller 148 exits the stationary warm-up strategy process.

Figure 3:
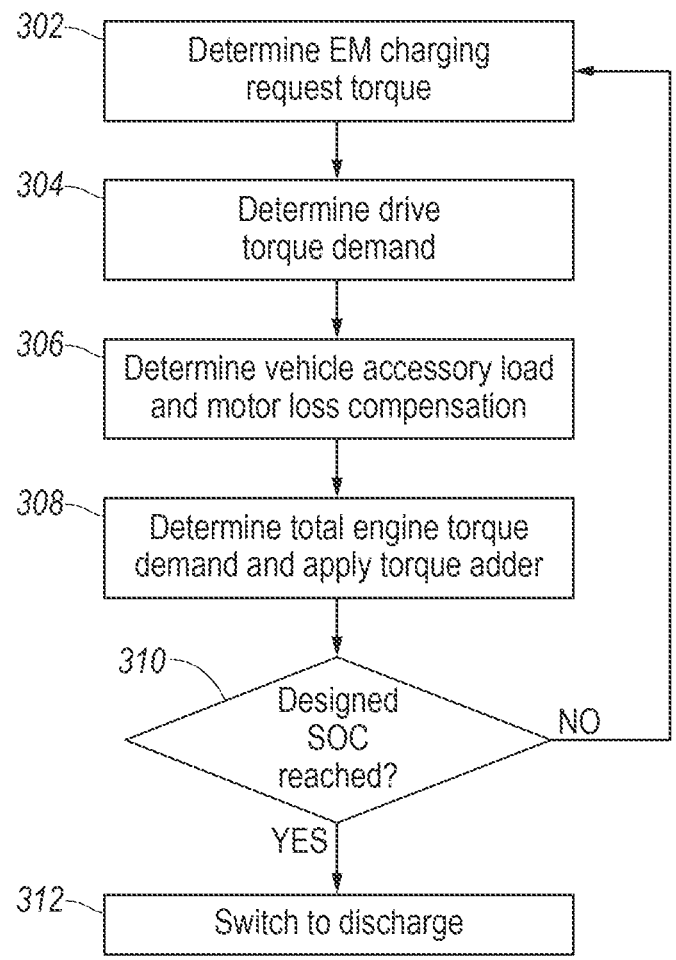
FIG. 3 is a flow diagram of a battery charging process.

Referring to FIG. 3, an example flow diagram for a battery charging process 300 is illustrated. With continuing reference to FIGS. 1 and 2, the battery charging process described herein may be applied to operation 208 discussed above. At operation 302, the system controller 148 determines a torque demand for satisfying the charge demand by the electric machine 114 which may depend on various factors such as battery temperature, current SOC or the like. At operation 304, the system controller 148 determines if a drive torque demand is presently input by a vehicle user. The drive torque demand may be an additional torque demand manually input by the user via an accelerator pedal (not shown) while the vehicle 112 is stationary. For instance, the user may lightly press the accelerator pedal to increase the engine RPM to warmup the engine more quickly. At operation 306, the system controller 148 measures the power demanded by the vehicle accessory loads 146, 129, and converts the load into an additional torque demand. The system controller 148 further determines the motor loss compensation of the engine 118. The motor loss compensation may be calculated using various factors, including but not limited to, coolant temperature, oil temperature, oil viscosity, or the like. At operation 308, the system controller 148 calculates the total engine torque demand by summing up all the torque determined above and applies the torque to the engine 118. A torque adder may be applied to the engine 118 to boost the torque output to satisfy all of the torque demands. At operation 310, the system controller 148 verifies if the traction battery 124 has reached the desired SOC calibration threshold. If the answer is a yes, the process proceeds to operation 312 to switch to the discharging mode. Otherwise, the process returns to operation 302 to continue to charge the traction battery 124.

Figure 4:
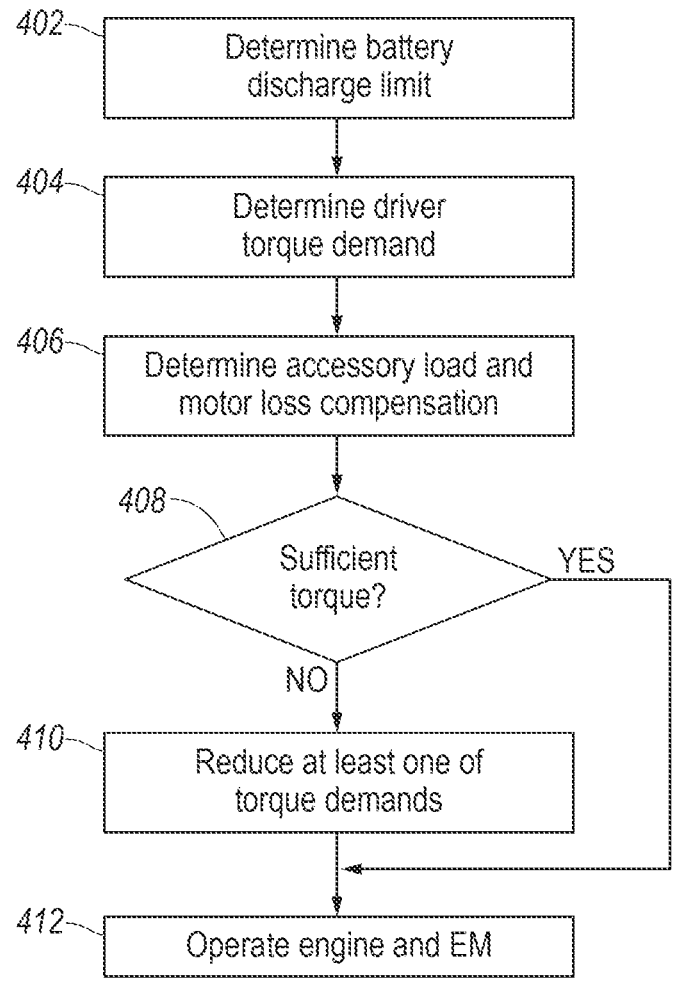
FIG. 4 is a flow diagram of a battery discharging process.

Referring to FIG. 4, an example flow diagram for a battery discharging process 400 is illustrated. With continuing reference to FIGS. 1-3, at operation 402, the system controller 148 determines a discharge power limit for the traction battery 124. The discharge power limit may be dependent on the temperature of the battery 124. As the battery 124 warms up, the discharge power limit may gradually increase. The discharge power limit may be converted into a torque output capability by the electric machine 114. At operation 404, the system controller 148 determines if a driver torque demand is present via the accelerator for example. At operation 406, the system controller 148 measures the power demanded by the vehicle accessory loads 146, 129 and determines the motor loss compensation for the engine 118 similar to the process at operation 306. As will be discussed in detail below, the electric machine 114 may be further configured to drive the engine 118 while no fuel is supplied to the engine 118. The extra torque demand to drive the engine 118 may be calculated at operation 406. At operation 408, the system controller 148 verifies if the battery power discharge limit is sufficient to satisfy the torque demand by comparing the torque output capability with the total torque demand. If the battery power discharge limit is sufficient, the process proceeds to operation 412 and the system controller 148 operates the engine 118 and the electric machine 114 to discharge the traction battery 114. Otherwise, if the battery discharge limit is insufficient to satisfy all of the torque demands, the process proceeds to operator 410 and the system controller 148 reduces at least one of the torque demands to make the total demand within the discharge torque limit. As an example, the system controller 148 may reduce the engine drive torque demand by supplying fuel and fully powering the engine 118. Alternatively, the system controller 148 calculates a shortfall torque between the torque demand and the available torque, and reduces the engine fuel supply accordingly such that the engine 118 is partially operated by the electric machine 114. For instance, the system controller 148 may shut off the fuel injection to one or more cylinders of the engine while continuing to inject fuel to the rest of the cylinders so that the engine rotation is enabled partially by the electric machine 114 and partially by the fuel injections.

Figure 5:
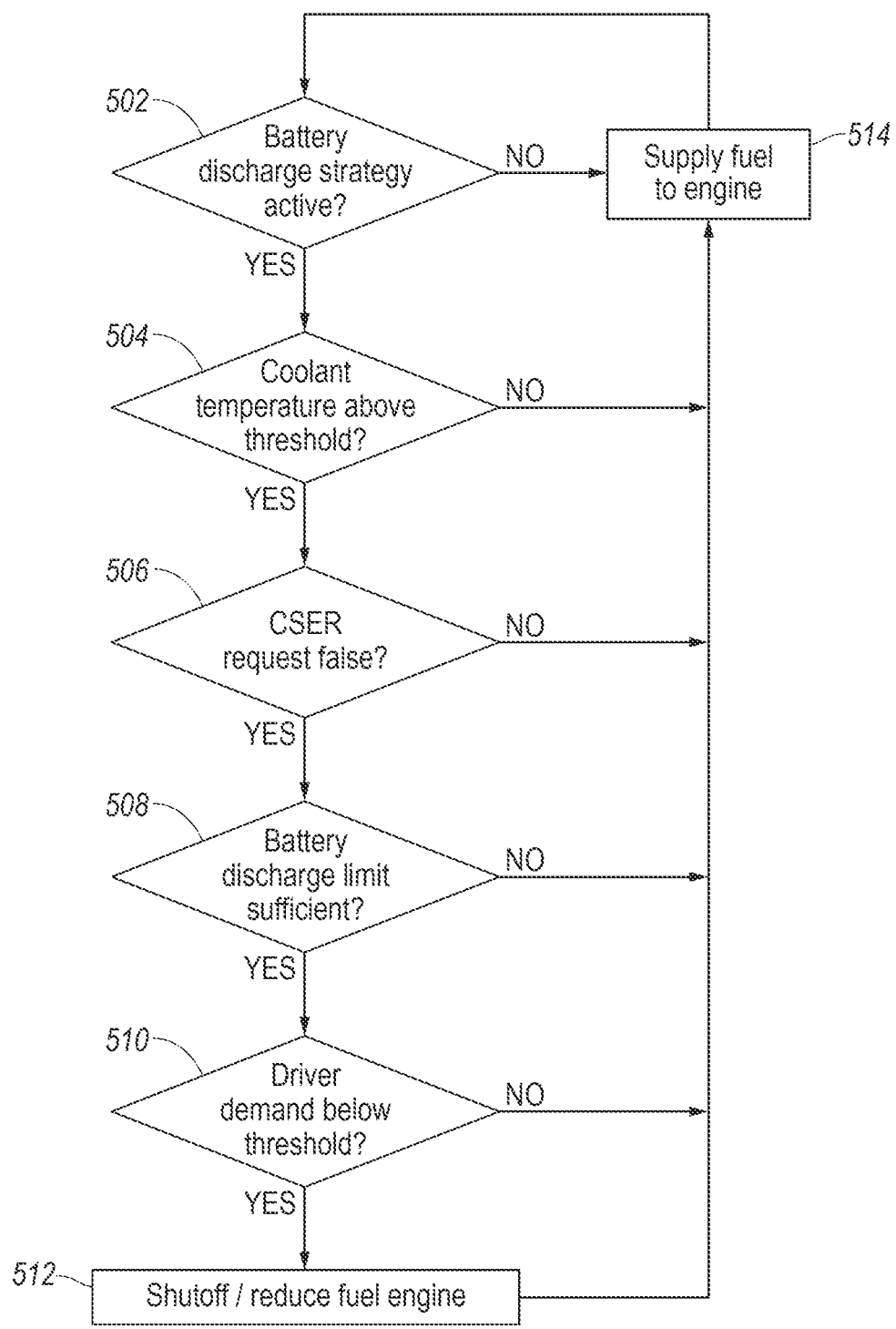
FIG. 5 is a flow diagram of a process for operating engine fuel shutoff/reduction.

The system described herein may be further configured to increase the battery discharge power to enhance the warm-up effect by driving the engine 118 using the electric machine 114 while the fuel supply is shut off or reduced. In this case the engine rotation may provide an extra load to the electric machine 114. The system controller may operate the electric machine 114 and the engine 118 in the fuel shutoff/reduction mode responsive to one or more predefined conditions being met. Referring to FIG. 5, an example flow diagram of a process 500 for monitoring and controlling the engine fuel shutoff or reduction is illustrated. At operation 502, the system controller 148 verifies if the stationary battery warm-up strategy control process is activated. If the stationary battery warm-up strategy is not activated (e.g., operation 216 referring to FIG. 2), the process proceeds to operation 514 and the system controller 148 supplies fuel to the engine 118 to sustain the engine rotation. Otherwise, if the stationary battery warm-up strategy is activated, the process proceeds from operation 502 to operation 504, and the system controller 148 verifies if the engine coolant temperature is above a predetermined threshold. For instance, hot coolant may be needed for vehicle cabin heating, and the system may be prohibited from entering the fuel shutoff/reduction mode until the coolant temperature is sufficient to provide a desirable cabin temperature. If the answer for operation 504 is a no, the process proceeds to operation 514. Otherwise, the process proceeds to operation 506, and the system controller 148 verifies if the cold start emission reduction (CSER) request is false. An active CSER request may prohibit the engine 118 from operating at the fuel shutoff/reduction mode and therefore the process proceeds to operation 514 if that is the case.

Otherwise, the process proceeds to operation 508 and the system controller 148 verifies if the battery discharge limit is sufficient to rotate the engine 118 with the fuel shut off or reduced. The torque output capability of the electric machine 114 may be calculated by the battery discharge power as discussed above. The power demand for the engine fuel shutoff/reduction mode may be calculated using various factors. As an example, the system controller 148 may calculate an engine torque demand using one or more mechanical characteristics of the engine 118. The mechanical characteristics may include an engine friction parameter, pumping lose parameter, front/rear end accessory drive parameter, or required transmission drive input power or the like as a few non-limiting examples. With the engine torque demand calculated, the system controller 148 may further determine the accessory load torque (e.g., operation 306 referring to FIG. 3). The system controller 148 may further apply a safe margin torque in addition to the engine torque demand and the accessory load torque to calculate the total torque required for the fuel shutoff/reduction mode. If the answer is a no, indicating the battery discharge limit is insufficient, the process proceeds to operation 514. Otherwise, the process proceeds to operation 510 to verify if a driver torque demand is below a predefined torque threshold. If the driver demand is not below the threshold, the process proceeds to operation 514. Otherwise, if all conditions from operation 502 to operation 510 are met, the process proceeds to operation 512 to perform the engine fuel shut off or reduction strategy as calculated.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
    an engine;
    an electric machine coupled to the engine;
    a traction battery configured to supply power to the electric machine; and
    a controller programmed to,
        responsive to the vehicle not moving, a temperature of the traction battery being less than a first temperature threshold, and a state-of-charge (SOC) of the traction battery being greater than a first SOC threshold, rotate the engine via the electric machine powered by the traction battery while no fuel is supplied to the engine,
        calculate an available torque from the electric machine using the temperature of the traction battery and a total toque demand including an engine torque demand without fuel and an accessory torque demand, and responsive to the available torque being insufficient to satisfy the total torque demand, to supply fuel to the engine.

2. The vehicle of claim 1, wherein the controller is further programmed to, responsive to the available torque being insufficient to satisfy the total torque demand, reduce the fuel supplied to the engine such that engine rotation is enabled partially by the electric machine and partially by the fuel supplied.

3. The vehicle of claim 1, wherein the controller is further programmed to, responsive to the SOC of the traction battery falling below a second SOC threshold less than the first SOC threshold, supply fuel to the engine to drive the electric machine operating as a generator to charge the traction battery, and apply an added torque to the electric machine to provide an increased charging power.

4. The vehicle of claim 1, wherein the controller is further programmed to, responsive to a coolant temperature of the engine being less than a coolant threshold, prohibit shutting the fuel supply off to the engine.

5. A method comprising:
    while a temperature of a traction battery is less than a first temperature threshold, rotating an engine with an electric machine coupled thereto when no fuel is supplied to the engine; and
    calculating an available torque from the electric machine using the temperature of the traction battery and a total toque demand including an engine torque demand without fuel and an accessory torque demand, and while the available torque is insufficient to satisfy the total torque demand, supplying fuel to the engine.

6. The method of claim 5 further comprising, while the available torque is insufficient to satisfy the total torque demand, reducing the fuel supplied to the engine such that engine rotation is enabled partially by the electric machine and partially by the fuel supplied.

7. The method of claim 5 further comprising, while a state-of-charge (SOC) of the traction battery is less than a SOC threshold, supplying fuel to the engine to drive the electric machine to charge the traction battery, and applying an added torque to the electric machine to provide an increased charging power.

8. The method of claim 5 further comprising, while a coolant temperature of the engine is less than a coolant threshold, prohibiting shutting the fuel supply off to the engine.

9. A powertrain system comprising:
    a traction battery; and
    a controller programmed to,
        while a temperature of the traction battery is less than a first temperature threshold and a state-of-charge (SOC) of the traction battery is greater than a first SOC threshold, command the traction battery to provide power to an electric machine to rotate an engine mechanically coupled therewith while no fuel is supplied to the engine,
        calculate an available torque from the electric machine using the temperature of the traction battery and a total toque demand including an engine torque demand without fuel and an accessory torque demand, and while the available torque is insufficient to satisfy the total torque demand, command fuel to be supplied to the engine.

10. The power system of claim 9, wherein the controller is further programmed to, while the available torque is insufficient to satisfy the total torque demand, command a reduction in fuel supplied to the engine such that engine rotation is enabled partially by the electric machine and partially by the fuel supplied.

11. The power system of claim 9, wherein the controller is further programmed to, while a SOC of the traction battery is less than a second SOC threshold, command fuel to be supplied the engine to drive the electric machine to charge the traction battery, and command an added torque be applied to the electric machine to provide an increased charging power.

12. The power system of claim 9, wherein the controller is further programmed to, while a coolant temperature of the engine is less than a coolant threshold, inhibit shutting the fuel supply off to the engine.

* * * * *